US012732012B2

(12) United States Patent
Nam et al.

(10) Patent No.: US 12,732,012 B2
(45) Date of Patent: Sep. 8, 2026

(54) BATTERY MANAGEMENT SYSTEM AND A BATTERY MANAGEMENT METHOD WITH A PLURALITY OF CONSTANT CURRENT CHARGING STAGES FOR A BATTERY

(71) Applicant: LG Energy Solution, Ltd., Seoul (KR)

(72) Inventors: Gi-Min Nam, Daejeon (KR); Hyeong-Seok Kim, Daejeon (KR); Tae-Hyun Hwang, Daejeon (KR); Won-Tae Joe, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 896 days.

(21) Appl. No.: 17/924,417

(22) PCT Filed: Jun. 16, 2021

(86) PCT No.: PCT/KR2021/007577
§ 371 (c)(1),
(2) Date: Nov. 10, 2022

(87) PCT Pub. No.: WO2021/256864
PCT Pub. Date: Dec. 23, 2021

(65) Prior Publication Data

US 2023/0182618 A1 Jun. 15, 2023

(30) Foreign Application Priority Data

Jun. 18, 2020 (KR) ........................ 10-2020-0074421

(51) Int. Cl.
*H02J 7/92* (2026.01)
*B60L 58/12* (2019.01)
(Continued)

(52) U.S. Cl.
CPC ................ *H02J 7/92* (2026.01); *B60L 58/12* (2019.02); *G01R 31/3648* (2013.01);
(Continued)

(58) Field of Classification Search
CPC ........ H02J 7/0071; H02J 7/0048; H02J 7/007; H02J 7/007182; H02J 7/92; H02J 7/82;
(Continued)

(56) References Cited

U.S. PATENT DOCUMENTS 6,563,318 B2 * 5/2003 Kawakami ........... G01R 31/389 324/426
7,446,508 B2 * 11/2008 Aradachi .......... H02J 7/007194 320/150

(Continued)

FOREIGN PATENT DOCUMENTS

CN 102785580 A 11/2012
CN 103241130 A 8/2013

(Continued)

OTHER PUBLICATIONS

International Search Report for Application No. PCT/KR2021/007577 mailed Sep. 23, 2021, pp. 1-3.

(Continued)

*Primary Examiner* — John T Trischler
(74) *Attorney, Agent, or Firm* — Lerner David LLP

(57) ABSTRACT

A battery management system and a battery management method. The battery management system includes a sensing unit to generate a sensing signal indicating a voltage and a current of a battery, a memory unit to store a reference charging map for constant-current charging using first to $m^{th}$ reference C-rates, and a control unit to determine a start value indicating a charge factor at a time point at which a charge command is received based on the sensing signal. The control unit generates first to $m^{th}$ reference charge functions corresponding to the first to $m^{th}$ reference C-rates in a one-to-one relationship from the reference charging map. When a charge cycle starts, the control unit controls a charge current supplied to the battery using the first to $m^{th}$ reference C-rates in a sequential order based on the sensing (Continued)

signal, the start value and the first to $m^{th}$ reference charge functions.

15 Claims, 5 Drawing Sheets

(51) Int. Cl.
*G01R 31/36* (2020.01)
*G01R 31/367* (2019.01)
*G01R 31/382* (2019.01)
*H02J 7/82* (2026.01)
*H02J 7/90* (2026.01)
*H02J 7/96* (2026.01)
*B60L 50/50* (2019.01)
*B60L 53/62* (2019.01)
*B60L 58/10* (2019.01)
*B60L 58/15* (2019.01)
*G01R 31/392* (2019.01)
*G01R 31/396* (2019.01)
*H01M 10/42* (2006.01)
*H01M 10/44* (2006.01)
*H02J 7/80* (2026.01)
*H02J 7/94* (2026.01)

(52) U.S. Cl.
CPC ......... *G01R 31/367* (2019.01); *G01R 31/382* (2019.01); *H02J 7/82* (2026.01); *H02J 7/90* (2026.01); *H02J 7/96* (2026.01); *B60L 50/50* (2019.02); *B60L 53/62* (2019.02); *B60L 58/10* (2019.02); *B60L 58/15* (2019.02); *B60L 2240/547* (2013.01); *B60L 2240/549* (2013.01); *G01R 31/392* (2019.01); *G01R 31/396* (2019.01); *H01M 10/425* (2013.01); *H01M 2010/4271* (2013.01); *H01M 10/44* (2013.01); *H01M 2220/20* (2013.01); *H02J 7/80* (2026.01); *H02J 7/933* (2026.01); *H02J 7/94* (2026.01); *H02J 7/947* (2026.01); *Y02T 10/70* (2013.01)

(58) Field of Classification Search
CPC .......... H02J 7/90; H02J 7/96; G01R 31/3648; G01R 31/367; G01R 31/382; B60L 58/12
USPC .................................................. 320/127, 160
See application file for complete search history.

(56) References Cited

U.S. PATENT DOCUMENTS 7,525,290 B2 * 4/2009 Miyata .................. H02J 7/0071 320/155
7,528,574 B1 * 5/2009 Adkins ................. H02J 7/0071 320/128
7,593,823 B2 * 9/2009 Iwane .................. G01R 31/392 320/132
7,733,060 B2 * 6/2010 Kojima ............. H02J 7/007182 324/427
7,834,591 B2 * 11/2010 Hussain ................ H01M 10/44 320/128
8,148,950 B2 * 4/2012 Matsuura .......... H02J 7/007194 320/132
8,203,314 B2 * 6/2012 Odaohhara ....... H02J 7/007194 320/128
8,288,995 B2 * 10/2012 Jimbo ............... H02J 7/007182 320/147
8,305,045 B2 * 11/2012 Maeagawa ........ H02J 7/007182 320/141
8,541,986 B2 * 9/2013 Hiraoka .............. H02J 7/00712 320/162
8,610,408 B2 * 12/2013 Nakai .................. H01M 10/48 320/160
9,190,863 B2 * 11/2015 Park ........................ H02J 7/007
9,240,696 B2 * 1/2016 Renken ................. H01M 10/44
9,246,344 B2 * 1/2016 Suzuki .................. H01M 10/44
9,515,505 B2 * 12/2016 Yang ...................... G01R 31/36
9,559,543 B2 * 1/2017 Greening ............. H01M 10/48
9,627,719 B2 * 4/2017 Jung ................... H01M 10/443
9,634,497 B2 * 4/2017 Baek ..................... H02J 7/0071
9,917,458 B2 * 3/2018 Lee ...................... H02J 7/00711
10,291,051 B2 * 5/2019 Pourdarvish ...... H02J 7/007182
10,295,604 B2 * 5/2019 Oh ....................... G01R 31/367
10,536,018 B2 * 1/2020 Jung ................... H02J 7/00712
10,566,815 B2 * 2/2020 Fujita .................. H01M 10/425
10,857,895 B2 * 12/2020 Oh ..................... H01M 10/425
10,886,742 B2 * 1/2021 Geinzer .................. H02J 3/381
10,985,590 B2 * 4/2021 Lim .................... H01M 10/425
11,027,624 B2 * 6/2021 Grace ............... H02J 7/007194
11,050,285 B2 * 6/2021 Jung ................... H02J 7/00308
11,056,900 B2 * 7/2021 Dang ................ H02J 7/007182
11,056,901 B2 * 7/2021 Song ......................... H02J 7/00
11,177,675 B2 * 11/2021 Abe ...................... H02J 7/0048
11,251,638 B2 * 2/2022 Chiu ................... H02J 7/00714
11,460,506 B2 * 10/2022 Kim ..................... G01R 31/382
11,588,341 B2 * 2/2023 Song ..................... H01M 4/525
11,594,906 B2 * 2/2023 Kim ........................ H02J 7/007
11,637,330 B2 * 4/2023 Oh ...................... H01M 10/425 320/152
11,811,255 B2 * 11/2023 Soga ..................... H01M 4/587
11,876,397 B2 * 1/2024 Lim .................... H01M 10/425
11,912,158 B2 * 2/2024 Seo ....................... H02J 7/0048
12,007,449 B2 * 6/2024 Cha ....................... H01M 10/48
12,123,914 B2 * 10/2024 Lee ...................... G01R 31/367
12,126,203 B2 * 10/2024 Miyaki ................... H02J 7/007
12,344,120 B2 * 7/2025 Cha .................... G01R 31/3842
12,370,922 B2 * 7/2025 Seo ...................... G01R 31/388
12,384,271 B2 * 8/2025 Kim ....................... G06Q 50/06
12,500,438 B2 * 12/2025 Lim ...................... H02J 7/0048
2006/0220620 A1 * 10/2006 Aradachi .................. H02J 7/04 320/150
2007/0001646 A1 * 1/2007 Kojima ................. H02J 7/0032 320/128
2007/0188134 A1 * 8/2007 Hussain ................ H02J 7/0071 320/114
2007/0278991 A1 * 12/2007 Miyata .................. H02J 7/0071 320/104
2008/0120050 A1 * 5/2008 Iwane .................. G01R 31/392 320/136
2009/0085527 A1 * 4/2009 Odaohhara ....... H02J 7/007194 320/150
2009/0153104 A1 * 6/2009 Matsuura .......... H02J 7/007194 320/152
2010/0072948 A1 * 3/2010 Sun ...................... G01R 31/367 320/134
2010/0327810 A1 * 12/2010 Jimbo .................. H02J 7/0071 320/126
2011/0025277 A1 * 2/2011 Hussain ............ H02J 7/007182 320/163
2011/0112782 A1 * 5/2011 Majima ................. H01M 10/48 324/427
2011/0181249 A1 * 7/2011 Deguchi ............... H02J 7/0013 320/149
2011/0267001 A1 * 11/2011 Hiraoka ............ H01M 10/0525 320/162
2011/0316487 A1 * 12/2011 Nakai ..................... H01M 4/485 320/160
2012/0086406 A1 * 4/2012 Maeagawa ........ H02J 7/007182 320/162
2013/0138370 A1 5/2013 Oh et al.
2013/0207618 A1 * 8/2013 Renken ............. H02J 7/007182 320/155
2013/0335034 A1 * 12/2013 Suzuki .............. H01M 10/0525 320/160
2014/0084851 A1 * 3/2014 Park .................. H02J 7/007182 320/160
2014/0265945 A1 9/2014 Deboy

(56) References Cited

U.S. PATENT DOCUMENTS

2014/0336840 A1* 11/2014 Geinzer .................. H02J 3/381 700/297
2015/0022160 A1* 1/2015 Greening .......... H02J 7/007194 320/162
2015/0077058 A1* 3/2015 Jung ..................... H01M 10/44 320/112
2015/0340885 A1 11/2015 Baek et al.
2015/0357859 A1* 12/2015 Pourdarvish ........ H02J 7/00712 320/159
2016/0049821 A1 2/2016 Aridome
2016/0064967 A1* 3/2016 Lee ...................... H02J 7/00711 320/112
2016/0190843 A1* 6/2016 Yang ...................... H02J 7/007 320/152
2017/0126023 A1 5/2017 Jung
2017/0288417 A1* 10/2017 Trichy ...................... H02J 7/35
2018/0076633 A1* 3/2018 Fujita .................. H02J 7/00047
2018/0123354 A1* 5/2018 Lim .................... H01M 10/425
2018/0241223 A1* 8/2018 Bae ..................... H02J 7/00712
2019/0084435 A1* 3/2019 Grace ................. H01M 10/441
2019/0176641 A1 6/2019 Baek et al.
2019/0195957 A1 6/2019 Chiba
2019/0202299 A1* 7/2019 Oh ...................... H01M 10/425
2019/0222051 A1* 7/2019 Pourdarvish ...... H02J 7/007184
2019/0237974 A1* 8/2019 Dang .................. H02J 7/00714
2019/0237975 A1 8/2019 Song et al.
2019/0334355 A1* 10/2019 Kim .................. H02J 7/007194
2019/0363546 A1 11/2019 Abe et al.
2020/0036193 A1* 1/2020 Song ..................... H01M 4/587
2020/0039376 A1 2/2020 Miyaki et al.
2020/0119562 A1* 4/2020 Jung ......................... H02J 7/04
2020/0203956 A1* 6/2020 Chiu ................... H01M 10/054
2020/0403432 A1* 12/2020 Soga ................. H01M 10/0525
2021/0053450 A1* 2/2021 Oh ...................... H01M 10/425
2021/0135474 A1* 5/2021 Ha ...................... H02J 7/00712
2021/0199723 A1* 7/2021 Kim ..................... G01R 31/392
2021/0210971 A1* 7/2021 Lim .................... H01M 10/425
2021/0370796 A1* 12/2021 Seo ....................... H02J 7/0048
2022/0006313 A1* 1/2022 Lim .................... H01M 10/486
2022/0029439 A1* 1/2022 Justin .................... H02J 7/0071
2022/0158468 A1* 5/2022 Cha ........................... B60L 3/12
2022/0221516 A1* 7/2022 Lee ...................... G01R 31/367
2022/0281345 A1* 9/2022 Kim ..................... G01R 31/392
2022/0311061 A1* 9/2022 Chen ................. H02J 7/007188
2023/0191942 A1* 6/2023 Cha ..................... H01M 10/425 320/109
2023/0278459 A1* 9/2023 Nam ..................... H02J 7/0048 320/109
2023/0280408 A1* 9/2023 Nam ..................... H01M 10/44 320/162
2024/0039317 A1* 2/2024 Nam ......................... H02J 7/82
2024/0136844 A1* 4/2024 Lim ...................... H01M 10/48
2024/0300378 A1* 9/2024 Seo ....................... H01M 10/48
2024/0413661 A1* 12/2024 Lee .................... G01R 31/3835
2024/0421622 A1* 12/2024 Choi ................... H02J 7/00712
2025/0001900 A1* 1/2025 Kim ........................ B60L 53/66
2025/0070281 A1* 2/2025 Kim ...................... H01M 10/48
2026/0056257 A1* 2/2026 Nam .................. G01R 31/3842

FOREIGN PATENT DOCUMENTS

CN 110518650 A 11/2019
GB 947216 A 1/1964
JP 2010136488 A 6/2010
JP 5812032 B2 11/2015
JP 201863128 A 4/2018
JP 2019158531 A 9/2019
JP 2019205242 A 11/2019
JP 6717308 B2 7/2020
KR 20150133587 A 11/2015
KR 20170051031 A 5/2017
KR 101863036 B1 6/2018
KR 20180103412 A 9/2018
KR 20190068940 A 6/2019
KR 20190073151 A 6/2019
KR 20200025495 A 3/2020

OTHER PUBLICATIONS

Extended European Search Report including Written Opinion for Application No. 21826857.1 dated Jun. 27, 2023, pp. 1-9.

* cited by examiner

| Boundary value | | Reference value(SOC) | | | | | |
|---|---|---|---|---|---|---|---|
| | | A1 | A2 | ··· | Aj | ··· | An |
| Reference C-rate(C) | C1 | B11 | B12 | ··· | B1j | ··· | B1n |
| | C2 | B21 | B22 | ··· | B2j | ··· | B2n |
| | ⋮ | ⋮ | ⋮ | ··· | ⋮ | ··· | ⋮ |
| | Ci | Bi1 | Bi2 | ··· | Bij | ··· | Bin |
| | ⋮ | ⋮ | ⋮ | ··· | ⋮ | ··· | ⋮ |
| | Cm | Bm1 | Bm2 | ··· | Bmj | ··· | Bmn |

R1, R2, Ri, Rm

BATTERY MANAGEMENT SYSTEM AND A BATTERY MANAGEMENT METHOD WITH A PLURALITY OF CONSTANT CURRENT CHARGING STAGES FOR A BATTERY

CROSS-REFERENCE TO RELATED APPLICATIONS

The present application is a national phase entry under 35 U.S.C. § 371 of International Application No. PCT/KR2021/007577 filed Jun. 16, 2021, which claims priority from Korean Patent Application No. 10-2020-0074421 filed Jun. 18, 2020, all of which are incorporated herein by reference.

TECHNICAL FIELD

The present disclosure relates to battery charging technology.

BACKGROUND ART

Recently, there has been a rapid increase in the demand for portable electronic products such as laptop computers, video cameras and mobile phones, and with the extensive development of electric vehicles, accumulators for energy storage, robots and satellites, many studies are being made on high performance batteries that can be charged and discharged repeatedly.

Currently, commercially available batteries include nickel-cadmium batteries, nickel-hydrogen batteries, nickel-zinc batteries, lithium batteries and the like, and among them, lithium batteries have little or no memory effect, and thus they are gaining more attention than nickel-based batteries for their advantages that recharging can be done whenever it is convenient, the self-discharge rate is very low and the energy density is high.

In constant-current charging of a battery, when the current rate of the charge current is low, a very long time is required to fully charge the battery. In contrast, when the current rate of the charge current is too high, the battery may degrade fast. Accordingly, it is necessary to gradually adjust the current rate of the charge current according to the state of the battery during constant-current charging.

To gradually adjust the current rate during constant-current charging, a charging map having 'multi-stage constant-current charging protocol' is chiefly used. The charging map includes at least one data array that stores a relationship between a plurality of current rates and a plurality of changeover conditions. Each time each changeover condition is satisfied, the next current rate may be provided to the battery as the charge current. The current rate (referred to as 'C-rate') is a value obtained by dividing the charge current by the maximum capacity of the battery, and its unit is 'C'.

In the same charge cycle, as charging is performed over time, stresses by the charge current accumulate, for example, the polarization voltage increases, causing damage to the battery (for example, lithium metal deposition). Accordingly, in general, the charging map is prepared such that the C-rate of the charge current gradually reduces from the beginning of the charging to the end of the charging. For example, in the charging map, the C-rate (for example, 1.5 C) corresponding to the current changeover condition (for example, State of Charge (SOC) 50%) is higher than the C-rate (for example, 1.4 C) corresponding to the next changeover condition (for example, SOC 60%).

However, the conventional charging map is prepared on the premise that the charge cycle starts from the fully charged state (for example, SOC 0%) of the battery. Accordingly, even though the battery is not fully charged, the C-rate of the charge current is unconditionally limited by the charging map. For example, when the charge cycle starts at the battery SOC of 55%, among a plurality of C-rates, the maximum C-rate (for example, 2.0 C) is not used as the charge current, and constant-current charging starts by the charge current at a lower C-rate (for example, 1.5 C) than the maximum value. As a result, there is an unnecessary increase in the time taken to complete the charging.

SUMMARY

Technical Problem

The present disclosure is designed to solve the above-described problem, and therefore the present disclosure is directed to providing a battery management system, a battery management method, a battery pack and an electric vehicle, in which constant-current charging of a battery is performed using all a plurality of current rates in a sequential order by setting a changeover condition for each of the plurality of current rates based on a charge factor (for example, a State of Charge (SOC), a voltage) of the battery at the start time of the charge cycle.

These and other objects and advantages of the present disclosure may be understood by the following description and will be apparent from the embodiments of the present disclosure. In addition, it will be readily understood that the objects and advantages of the present disclosure may be realized by the means set forth in the appended claims and a combination thereof.

Technical Solution

According to an aspect of the present disclosure, a battery management system includes a sensing unit configured to generate a sensing signal indicating a voltage and a current of a battery, a memory unit configured to store a reference charging map for constant-current charging using first to $m^{th}$ reference current rates (C-rates), wherein m is a natural number of 2 or greater, and a control unit configured to determine a start value indicating a charge factor of the battery at a time point at which a charge command is received based on the sensing signal in response to the charge command being received. The control unit is configured to generate first to $m^{th}$ reference charge functions corresponding to the first to $m^{th}$ reference C-rates in a one-to-one relationship from the reference charging map. When a charge cycle including the constant-current charging starts, the control unit is configured to control a charge current supplied to the battery using the first to $m^{th}$ reference C-rates in a sequential order based on the sensing signal, the start value and the first to $m^{th}$ reference charge functions.

The control unit may be configured to replace the reference charging map stored in the memory unit with the first to $m^{th}$ reference charge functions.

The reference charging map may include first to $m^{th}$ reference arrays corresponding to the first to $m^{th}$ reference C-rates in a one-to-one relationship. Each reference array may include first to $n^{th}$ reference values and first to $n^{th}$ boundary values. n is a natural number of 2 or greater. When i is a natural number between 2 and m, and j is a natural number between 1 and n, a $j^{th}$ boundary value of the first reference array indicates an allowable limit value for constant-current charging with the first reference C-rate when the charge cycle starts at a time point at which the charge factor of the battery is equal to a $j^{th}$ reference value. A $j^{th}$ boundary value of an $i^{th}$ reference array indicates an allowable limit value for constant-current charging with an $i^{th}$ reference C-rate from a time point at which the charge factor of the battery reaches a $j^{th}$ boundary value of a $i-1^{th}$ reference array.

The $i^{th}$ reference C-rate may be smaller than an $i-1^{th}$ reference C-rate.

When k is a natural number between 2 and n, a $k^{th}$ reference value may be larger than a $k-1^{th}$ reference value, and a $k^{th}$ boundary value of the $i^{th}$ reference array may be larger than a $k-1^{th}$ boundary value of the $i^{th}$ reference array.

The control unit may be configured to determine first to $m^{th}$ changeover values from the first to $m^{th}$ reference charge functions respectively based on the start value, and output a first control signal. The first control signal may be a signal requesting to set the charge current to be equal to the first reference C-rate.

When an index value z is a natural number that is less than m, the control unit may be configured to increase z by 1 and output a $z^{th}$ control signal in response to the charge factor of the battery reaching a $z^{th}$ changeover value by the charge current of a $z^{th}$ reference C-rate. The $z^{th}$ control signal may be a signal requesting to set the charge current to be equal to the $z^{th}$ reference C-rate.

The control unit may be configured to output a changeover signal requesting to changer from the constant-current charging to constant-voltage charging with a threshold voltage in response to the charge factor of the battery reaching the $m^{th}$ changeover value by the charge current of the $m^{th}$ reference C-rate.

The control unit may be configured to set the threshold voltage to be equal to the voltage of the battery at a time point at which the charge factor of the battery reaches the $m^{th}$ changeover value.

The control unit may be configured to terminate the constant-voltage charging in response to the current of the battery reaching a threshold current during the constant-voltage charging.

A battery pack according to another aspect of the present disclosure includes a battery management system as described in any of the embodiments herein.

An electric vehicle according to still another aspect of the present disclosure includes the battery pack.

A battery management method according to yet another aspect of the present disclosure includes generating first to $m^{th}$ reference charge functions corresponding to first to $m^{th}$ reference C-rates in a one-to-one relationship from a reference charging map for constant-current charging using the first to $m^{th}$ reference C-rates, in response to receiving a charge command, determining a start value which is a charge factor of the battery at a time point at which the charge command is received, determining first to $m^{th}$ changeover values from the first to $m^{th}$ reference charge functions respectively based on the start value, outputting a first control signal requesting to set a charge current to be equal to the first reference C-rate to start a charge cycle including the constant-current charging, and when an index value z is a natural number that is less than m, increasing the z by 1 and outputting a $z^{th}$ control signal requesting to set the charge current to be equal to the $z^{th}$ reference C-rate in response to the charge factor of the battery reaching the $z^{th}$ changeover value by the charge current of the $z^{th}$ reference C-rate.

Advantageous Effects

According to at least one of the embodiments of the present disclosure, constant-current charging of a battery may be performed using all a plurality of current rates in a sequential order by setting a changeover condition for each of the plurality of current rates based on a charge factor (for example, a State of Charge (SOC), a voltage) of the battery at the start time of the charge cycle. Accordingly, it is possible to reduce the time taken to complete the charging since the charge current is gradually adjusted from maximum to minimum among a plurality of current rates even though the charge cycle starts when the battery is not fully discharged.

The effects of the present disclosure are not limited to the effects mentioned above, and these and other effects will be clearly understood by those skilled in the art from the appended claims.

BRIEF DESCRIPTION OF THE DRAWINGS

The accompanying drawings illustrate a preferred embodiment of the present disclosure, and together with the detailed description of the present disclosure described below, serve to provide a further understanding of the technical aspects of the present disclosure, and thus the present disclosure should not be construed as being limited to the drawings.

FIG. 2 is a diagram exemplarily showing a reference charging map.

DETAILED DESCRIPTION

Figure 1:
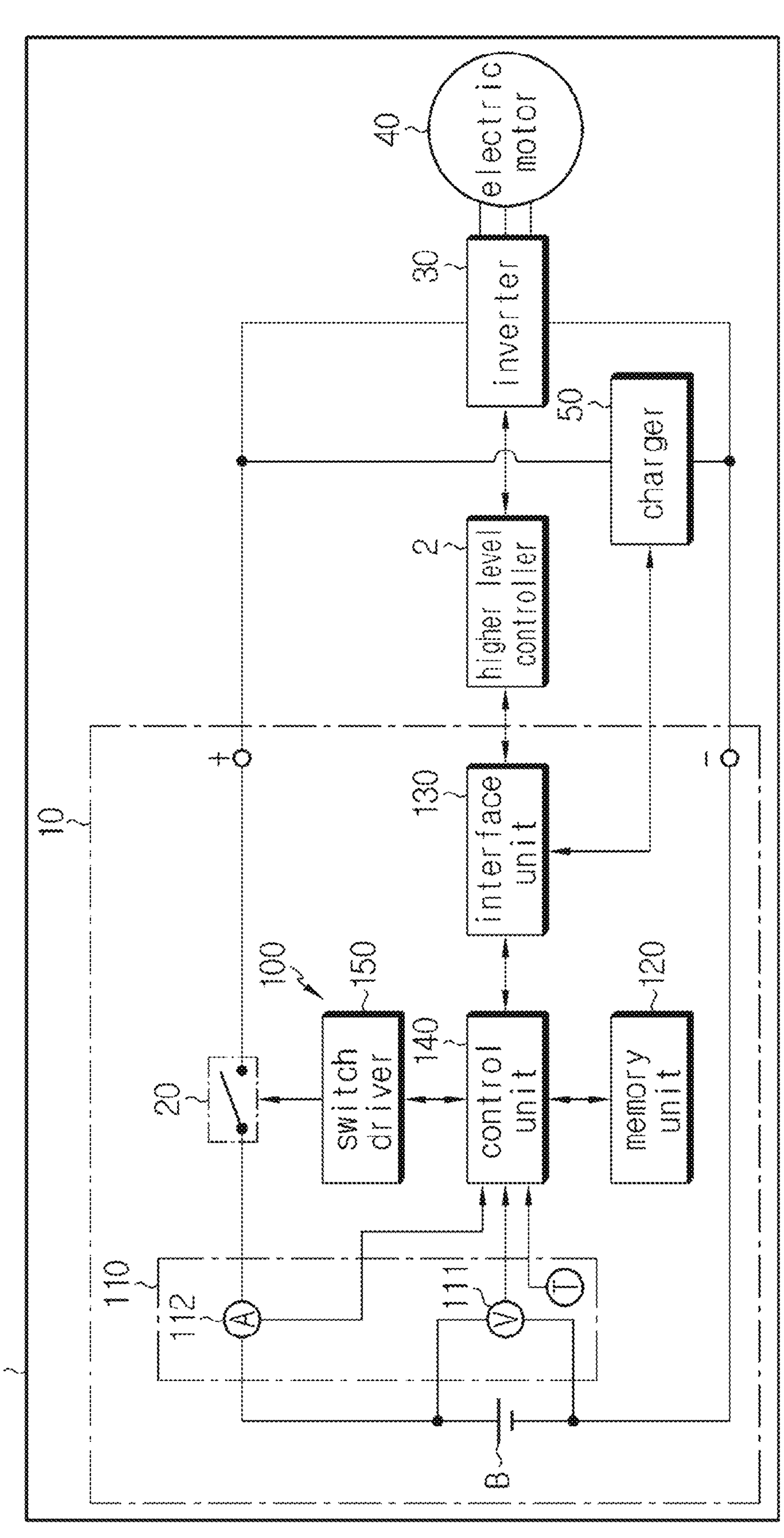
FIG. 1 is a diagram exemplarily showing a configuration of an electric vehicle according to an embodiment of the present disclosure.

Hereinafter, the preferred embodiments of the present disclosure will be described in detail with reference to the accompanying drawings. Prior to the description, it should be understood that the terms or words used in the specification and the appended claims should not be construed as being limited to general and dictionary meanings, but rather interpreted based on the meanings and concepts corresponding to the technical aspects of the present disclosure on the basis of the principle that the inventor is allowed to define the terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and modifications could have been made thereto at the time that the application was filed.

The terms including the ordinal number such as “first”, “second” and the like, are used to distinguish one element from another among various elements, but not intended to limit the elements by the terms.

Unless the context clearly indicates otherwise, it will be understood that the term “comprises” when used in this specification, specifies the presence of stated elements, but does not preclude the presence or addition of one or more other elements. Additionally, the term “unit” as used herein refers to a processing unit of at least one function or operation, and this may be implemented by hardware and software either alone or in combination.

In addition, throughout the specification, it will be further understood that when an element is referred to as being "connected to" another element, it can be directly connected to the other element or intervening elements may be present.

FIG. 1 is a diagram exemplarily showing a configuration of an electric vehicle 1 according to the present disclosure.

Referring to FIG. 1, the electric vehicle 1 includes a battery pack 10, an inverter 30 and an electric motor 40.

The battery pack 10 includes a battery 11, a switch 20 and a battery management system 100.

The battery 11 includes at least one battery cell. Each battery cell includes any type of battery cell that can be repeatedly charged and discharged, such as, for example, a lithium ion cell, but is not limited thereto. The battery 11 may be coupled to the inverter 30 and/or a charger 50 through a pair of power terminals provided in the battery pack 10.

The switch 20 is connected in series to the battery 11. The switch 20 is installed on a current path for the charge/discharge of the battery 11. The switch 20 is controlled to be on/off in response to a switching signal from the battery management system 100. The switch 20 may be a mechanical relay that is turned on/off by the electromagnetic force of a coil or a semiconductor switch such as a Metal Oxide Semiconductor Field Effect transistor (MOSFET).

The inverter 30 is provided to change a direct current (DC) power supply from the battery 11 to an alternating current (AC) power supply in response to a command from the battery management system 100. The electric motor 40 may be, for example, a 3-phase AC motor. The electric motor 40 works using the AC power from the inverter 30.

The battery management system 100 is provided to perform all control related to the charge/discharge of the battery 11.

The battery management system 100 includes a sensing unit 110, a memory unit 120 and a control unit 140. The battery management system 100 may further include at least one of an interface unit 130 or a switch driver 150.

The sensing unit 110 includes a voltage sensor 111 and a current sensor 112. The sensing unit 110 may further include a temperature sensor T.

The voltage sensor 111 is connected in parallel to the battery 11 and configured to detect a voltage across the battery 11 and generate a voltage signal indicating the detected voltage. The current sensor 112 is connected in series to the battery 11 through the current path. The current sensor 112 is configured to detect a current flowing through the battery 11, and generate a current signal indicating the detected current. The temperature sensor T is configured to detect a temperature of the battery 11 and generate a temperature signal indicating the detected temperature.

The memory unit 120 may include, for example, at least one type of storage medium of flash memory type, hard disk type, Solid State Disk (SSD) type, Silicon Disk Drive (SDD) type, multimedia card micro type, random access memory (RAM), static random access memory (SRAM), read-only memory (ROM), electrically erasable programmable read-only memory (EEPROM) or programmable read-only memory (PROM). The memory unit 120 may store data and programs required for the computation operation by the control unit 140. The memory unit 120 may store data indicating the result of the computation operation by the control unit 140.

The memory unit 120 stores at least one reference charging map. The reference charging map may be stored in the memory unit 120 before the battery management system 100 is released, or may be received from an external device (for example, a battery manufacturer) or a higher level controller 2 through the interface unit 130 before a charge command is received. When the memory unit 120 stores at least two reference charging maps, each reference charging map may be associated with different temperatures.

The interface unit 130 may include a communication circuit configured to support wired communication or wireless communication between the control unit 140 and the higher level controller 2 (for example, an Electronic Control Unit (ECU)). The wired communication may be, for example, controller area network (CAN) communication, and the wireless communication may be, for example, Zigbee or Bluetooth communication. The communication protocol is not limited to a particular type, and may include any communication protocol that supports wired/wireless communication between the control unit 140 and the higher level controller 2. The interface unit 130 may include an output device (for example, a display, a speaker) to provide information received from the control unit 140 and/or the higher level controller 2 in a recognizable format. The higher level controller 2 may control the inverter 30 based on battery information (for example, voltage, current, temperature, State of Charge (SOC)) collected via communication with the battery management system 100.

The control unit 140 may be operably coupled to the sensing unit 110, the higher level controller 2, the switch 20, the memory unit 120, the interface unit 130 and/or the switch driver 150.

The switch driver 150 is electrically coupled to the control unit 140 and the switch 20. The switch driver 150 is configured to selectively turn on/off the switch 20 in response to the command from the control unit 140. The control unit 140 may command the switch driver 150 to turn on the switch 20 during the charge cycle.

The control unit 140 may collect a sensing signal from the sensing unit 110. The sensing signal refers to the detected voltage signal, current signal and/or temperature signal in synchronization.

The control unit 140 may be implemented in hardware using at least one of application specific integrated circuits (ASICs), digital signal processors (DSPs), digital signal processing devices (DSPDs), programmable logic devices (PLDs), field programmable gate arrays (FPGAs), microprocessors or electrical units for performing other functions.

The control unit 140 performs two-way communication with the charger 50 through the interface unit 130. The charger 50 is configured to supply a charge current of a C-rate requested from the battery management system 100 to the battery 11. The charger 50 may be configured to supply the charge voltage having a voltage level requested from the battery management system 100 to the battery 11. In response to the charge command received from a user of a vehicle 1 through the interface unit 130, the control unit 140 is configured to determine initial state information of the battery 11 and start the charge cycle for constant-current charging.

The initial state information includes data indicating a charge factor of the battery 11 before the initial charge current by the charge cycle is supplied to the battery 11. The charge factor corresponds to electrical energy stored in the battery 11, and is a SOC or a voltage. That is, the charge factor is a value indicating a state in which the battery 11 is placed between a fully discharged state and a fully charged state. The control unit 140 determines (updates) the SOC as the charge factor of the battery 11 based on the sensing signal at a predetermined time interval during the charge cycle. To determine the SOC, well-known algorithms such as ampere counting and Kalman filter may be used. The initial state information includes data including the temperature of the battery 11 before the initial charge current by the charge cycle is supplied to the battery 11. When the memory unit 120 stores a plurality of reference charging maps associated with different temperatures, the control unit 140 may select one reference charging map associated with the temperature of the initial state information from the plurality of reference charging maps, and control the progression of the charge cycle using the selected reference charging map.

The reference sign m as used herein is a natural number of 2 or greater, i is a natural number of 2 or greater and m or smaller, n is a natural number of 2 or greater, and j is a natural number of 1 or greater and n or smaller.

Figure 3:
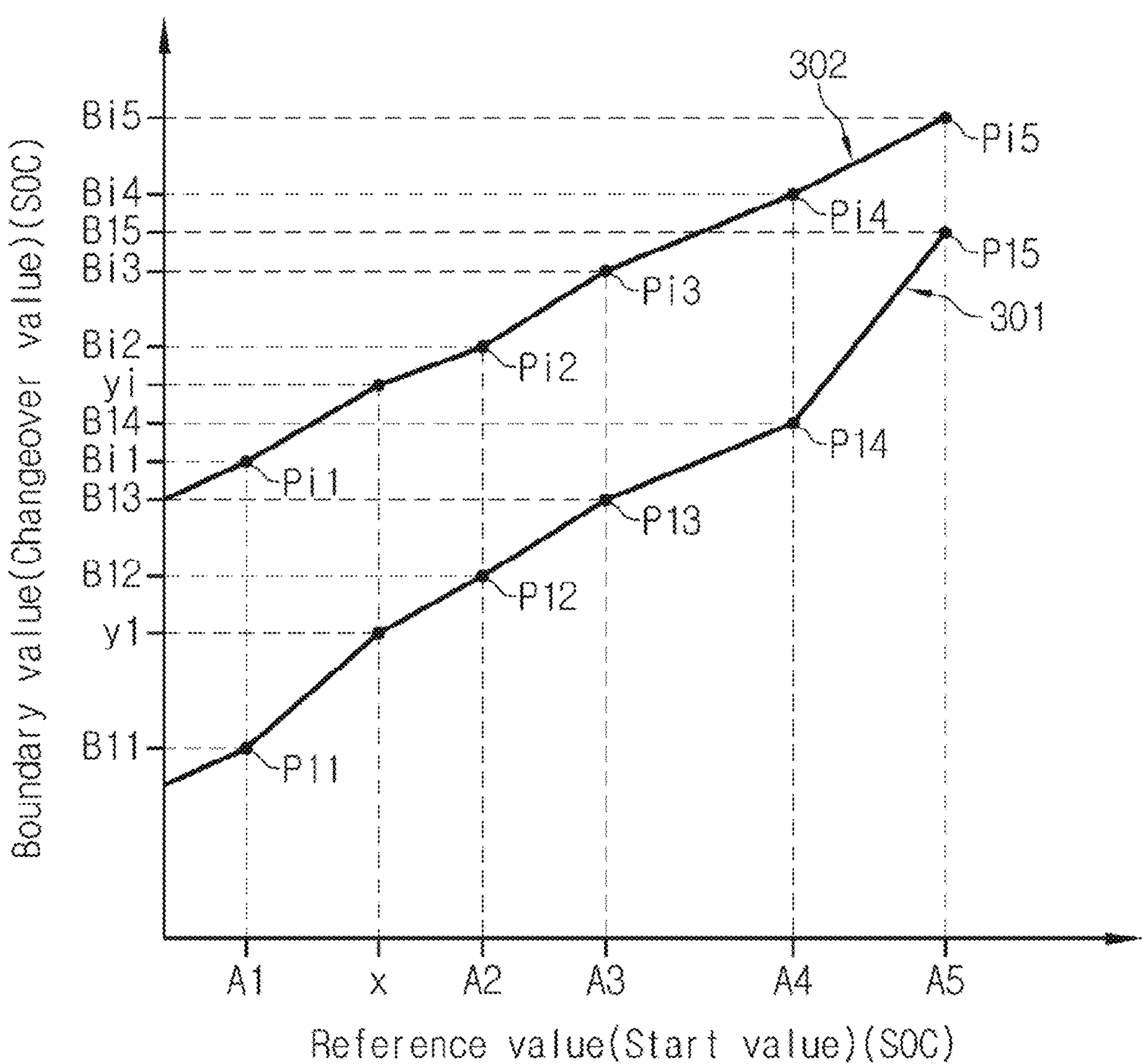
FIG. 3 is a diagram referenced in describing an exemplary reference charging function generated from a reference charging map.

FIG. 2 is a diagram exemplarily showing the reference charging map 200, and FIG. 3 is a diagram referenced in describing an exemplary reference charging function generated from the reference charging map 200 of FIG. 2.

Referring to FIG. 2, the reference charging map 200 is for constant-current charging using first to $m^{th}$ reference C-rates C1~Cm in a sequential order. That is, the reference charging map 200 defines a multi-stage constant-current protocol.

The reference charging map 200 may include first to $m^{th}$ reference arrays R1~Rm. The reference array Ri is associated with the $i^{th}$ reference C-rate Ci. The reference array Ri may include first to $n^{th}$ boundary values Bi1~Bin corresponding to first to $n^{th}$ reference values A1~An in a one-to-one relationship.

When SOC is used as the charge factor, the reference value may be referred to as a reference SOC, and the boundary value may be referred to as a boundary SOC. When voltage is used as the charge factor, the reference value may be referred to as a reference voltage, and the boundary value may be referred to as a boundary voltage.

The first reference C-rate C1 may be larger than the $i^{th}$ reference C-rate Ci. As i is higher, the $i^{th}$ reference C-rate Ci may be lower. For example, C1<Ci<Cm.

The first reference array R1 defines an allowable limit value for constant-current charging with the first reference C-rate from the start time of constant-current charging. Specifically, the $j^{th}$ boundary value B1*j* of the first reference array R1 indicates an allowable limit value for constant-current charging with the first reference C-rate C1 when constant-current charging of the charge cycle starts at the time point at which the charge factor of the battery 11 is equal to the $j^{th}$ reference value Aj. For example, when constant-current charging starts at the time point at which the charge factor of the battery 11 is equal to the first reference value A1, the charge current is maintained at the first reference C-rate C1 until the charge factor of the battery 11 reaches the first boundary value B11.

In the first reference array R1, as j is higher, Aj may increase. For example, A2 is larger than A1. Additionally, in the first reference array R1, Blj is larger than Aj. For example, B11 is larger than A1.

The second reference array defines an allowable limit value for charging with the second reference C-rate C2 from the time point at which the charge current is changed from the first reference C-rate C1 to the second reference C-rate C2 during constant-current charging. Specifically, the $j^{th}$ boundary value B2*j* of the second reference array R2 indicates an allowable limit value for constant-current charging with the second reference C-rate C2 from the time point at which the charge factor of the battery 11 reaches the $j^{th}$ boundary value B1*j* of the first reference array RE For example, when constant-current charging starts from the time point at which the charge factor of the battery 11 is equal to the first reference value A1, the charge current is maintained at the second reference C-rate C2 until the charge factor of the battery 11 reaches the first boundary value B21 of the second reference array R2 from the time point at which the charge factor of the battery 11 reaches the first boundary value B11 of the first reference array R1.

The $j^{th}$ boundary value Bij of the $i^{th}$ reference array Ri indicates an allowable limit value for constant-current charging with the $i^{th}$ reference C-rate Ci from the time point at which the charge factor of the battery 11 reaches the $j^{th}$ boundary value B(i−1)j of the $j^{th}$ reference array R(i−1). That is, the reference charging map 200 defines that the charge current will be supplied at the $i^{th}$ reference C-rate Ci in the charging range from the $j^{th}$ boundary value B(i−1)j of the i−$1^{th}$ reference array R(i−1) to the $j^{th}$ boundary value Bij of the $i^{th}$ reference array Ri.

In the reference charging map 200, when i is equal, as j increases, Bij may increase. For example, B12 is larger than B11. In the reference charging map 200, when j is equal, as i increases, Bij may increase. For example, B21 is larger than B11.

FIG. 3 shows a 2-dimensional graph of information recorded in the first reference array R1 and the $i^{th}$ reference array Ri of FIG. 2. For convenience of description, in FIG. 3, n is 5.

Referring to FIG. 3, a curve 301 indicates a relationship between the reference value and the boundary value recorded in the first reference array R1 used in constant-current charging with the first reference C-rate C1. A curve 302 indicates a relationship between the reference value and the boundary value recorded in the $i^{th}$ reference array Ri used in constant-current charging with the $i^{th}$ reference C-rate Ci.

The control unit 140 generates a first reference charge function corresponding to the first reference C-rate C1 based on five reference points P11~P15 as the relationship recorded in the first reference array R1.

The control unit 140 may generate an $i^{th}$ reference charge function corresponding to the $i^{th}$ reference C-rate based on five reference points Pi1~Pi5 as the relationship recorded in the first reference array R1.

Well-known curve fitting (for example, least squares) may be used to generate the reference charge function based on the reference points of each reference array. For example, the first reference charge function may be represented as a higher degree polynomial equation, Equation 1, and the $i^{th}$ reference charge function may be represented as a higher degree polynomial equation, Equation 2.

$$y_1 = \sum_{h=0}^{k} (\alpha_{1h} \times x^h) \quad \langle\text{Equation 1}\rangle$$

$$y_i = \sum_{h=0}^{k} (\alpha_{ih} \times x^h) \quad \langle\text{Equation 2}\rangle$$

In Equations 1 and 2, k indicates the degree of the higher degree polynomial equation, and x is a start value. The start value x indicates the charge factor of the battery 11 at the time point at which the charge command is received.

In Equation 1, $\alpha_{1h}$, indicates a coefficient of an h-th order term, and $y_1$ indicates a first changeover value. The first changeover value $y_1$ is an allowable limit value for charging with the first reference C-rate C1. In Equation 2, $\alpha_{ih}$ indicates the coefficient of the h-th order term, and $y_i$ denotes an $i^{th}$ changeover value. The $i^{th}$ changeover value $y_i$ is an allowable limit value for charging with the $i^{th}$ reference C-rate Ci. That is, generating the reference charge function from each reference array may represent calculating each coefficient of Equations 1 and 2. The control unit 140 may determine second to $m^{th}$ changeover values using Equation 2.

For example, where A1<x<A2, B11<$y_1$<B12, and Bi1<$y_i$<Bi2.

The control unit 140 may generate the first to $m^{th}$ reference charge functions sequentially or simultaneously based on the relationship recorded in the first to $m^{th}$ reference arrays R1~Rm, and replace the reference charging map 200 stored in the memory unit 120 with the first to $m^{th}$ reference charge functions. That is, the control unit 140 may store the first to $m^{th}$ reference charge functions in the memory unit 120, and delete the reference charging map 200 from the memory unit 120. Since the reference charge function changes the relationship indicated by each reference array to a single Equation, a data storage space that is smaller than the reference array may be required. Accordingly, an extra space in the memory unit 120 may be reclaimed by replacing the reference charging map 200 with the reference charge function.

The control unit 140 determines the first changeover value from the first reference charge function based on the start value. Subsequently, the control unit 140 may output a first control signal to the interface unit 130 to start the charge cycle. The interface unit 130 may transmit the first control signal to the charger 50. The first control signal may be a signal requesting to set the charge current to be equal to the first reference C-rate C1. The charger 50 supplies the charge current of the first reference C-rate C1 to the battery 11 until another control signal is received in response to the first control signal.

The control unit 140 may output a second control signal to change the charge current from the first reference C-rate C1 to the second reference C-rate in response to the charge factor of the battery 11 reaching the first changeover value y1. The interface unit 130 may transmit the second control signal to the charger 50. The second control signal may be a signal requesting to set the charge current to be equal to the second reference C-rate. The charger 50 supplies the charge current of the second reference C-rate to the battery 11 until another control signal is received in response to the second control signal.

The control unit 140 controls constant-current charging by outputting the control signal corresponding to each changeover value in a sequential order. When the charge command is received, the control unit 140 may set a current index z to be equal to 1, and increase the current index z by 1 each time the charge factor of the battery 11 reaches the zth changeover value. The control unit 140 outputs a $z^{th}$ control signal corresponding to the current index z. The $z^{th}$ control signal is a signal requesting to set the charge current to be equal to the $z^{th}$ reference C-rate. The charger 50 supplies the charge current of the $z^{th}$ reference C-rate to the battery 11 until another control signal is received in response to the $z^{th}$ control signal.

The control unit 140 may output a changeover signal in response to the charge factor of the battery 11 reaching the $m^{th}$ changeover value. The changeover signal is a signal requesting to change from constant-current charging to constant-voltage charging. The changeover signal may include data indicating a threshold voltage. The threshold voltage may be a preset voltage level or a voltage of the battery 11 at the time point at which the charge factor of the battery 11 reached the $m^{th}$ changeover value. The charger 50 supplies the charge voltage that is equal to the threshold voltage to the battery 11 in response to the changeover signal. When the $m^{th}$ changeover value indicates the fully charged state of the battery 11, the control unit 140 may terminate the charge cycle rather than outputting the changeover signal.

The control unit 140 may output a termination signal in response to the current of the battery 11 reaching the threshold current during constant-voltage charging. The charger 50 may terminate the charge cycle in response to the termination signal.

Figure 4:
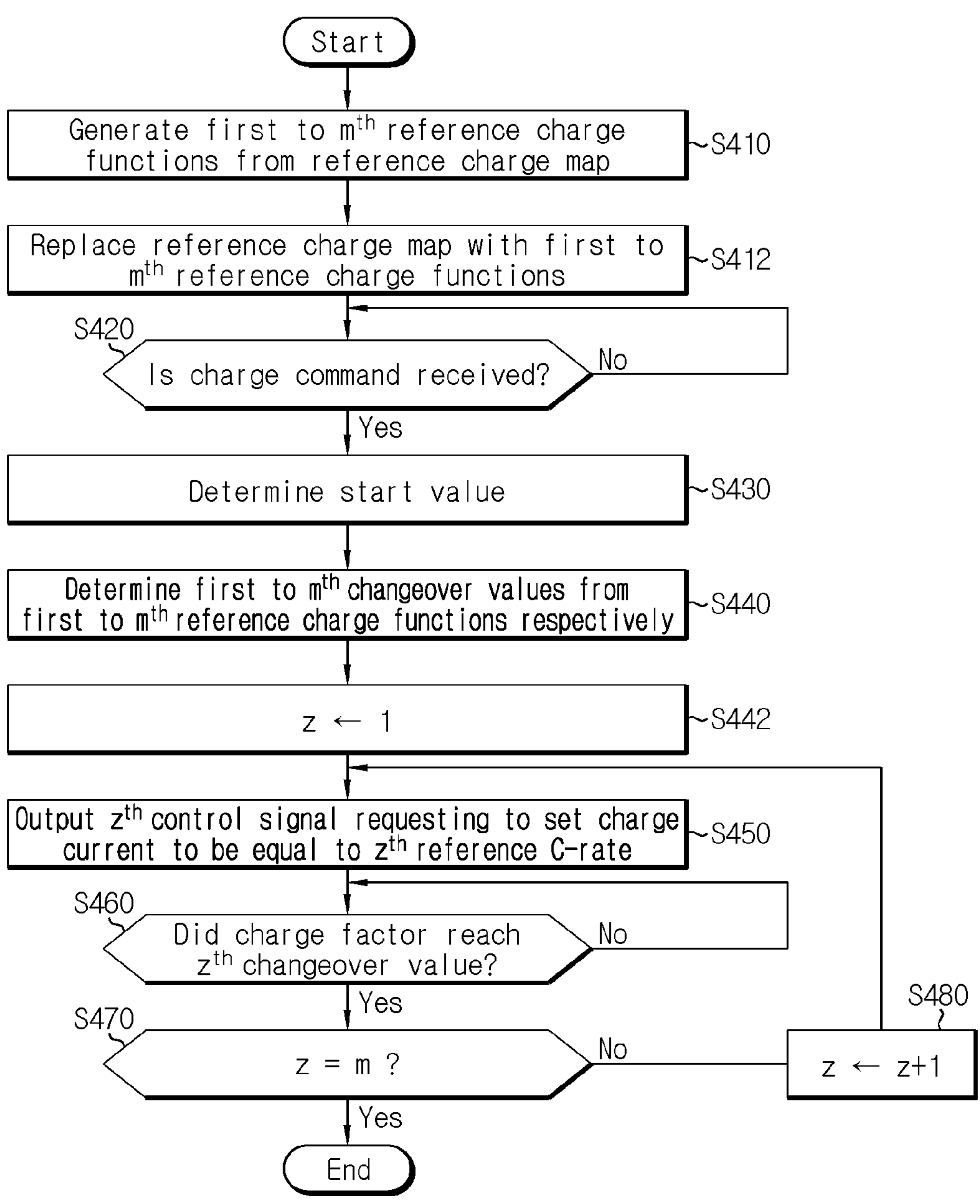
FIG. 4 is a flowchart exemplarily showing a battery management method according to a first embodiment of the present disclosure.

FIG. 4 is a flowchart exemplarily showing a battery management method according to a first embodiment of the present disclosure. The method of FIG. 4 is for constant-current charging included in the charge cycle.

Referring to FIGS. 1 to 4, in step S410, the control unit 140 generates first to $m^{th}$ reference charge functions corresponding to the first to $m^{th}$ reference C-rates Cm in a one-to-one relationship from the reference charging map 200 stored in the memory unit 120.

In step S412, the control unit 140 replaces the reference charging map 200 with the first to $m^{th}$ reference charge functions. Since the step S412 is not essential, the step S412 may be omitted from the method of FIG. 4.

In step S420, the control unit 140 determines whether a charge command was received. When a value of the step S420 is "Yes", the step S430 is performed.

In step S430, the control unit 140 determines a start value indicating the charge factor of the battery 11 at the time point at which the charge command is received.

In step S440, the control unit 140 determines first to $m^{th}$ changeover values from the first to $m^{th}$ reference charge functions respectively based on the start value. Each changeover value is used to change the charge current in a sequential order from the first reference C-rate C1 to the $m^{th}$ reference C-rate Cm.

In step S442, the control unit 140 sets a current index z to 1. The current index z is used to select a reference C-rate to currently use from the first to $m^{th}$ reference C-rates.

In step S450, the control unit 140 outputs a $z^{th}$ control signal requesting to set the charge current to be equal to the $z^{th}$ reference C-rate.

In step S460, the control unit 140 determines whether the charge factor of the battery 11 reached the $z^{th}$ changeover value. When a value of the step S460 is "Yes", step S470 is performed.

In step S470, the control unit 140 determines whether the current index z is equal to m. When a value of the step S470 is "No", step S480 is performed. When the value of the step S470 is "Yes", the constant-current charging according to the method of FIG. 4 may end.

In step S480, the control unit 140 increases the current index z by 1. After the step S472, the method returns to the step S450.

Figure 5:
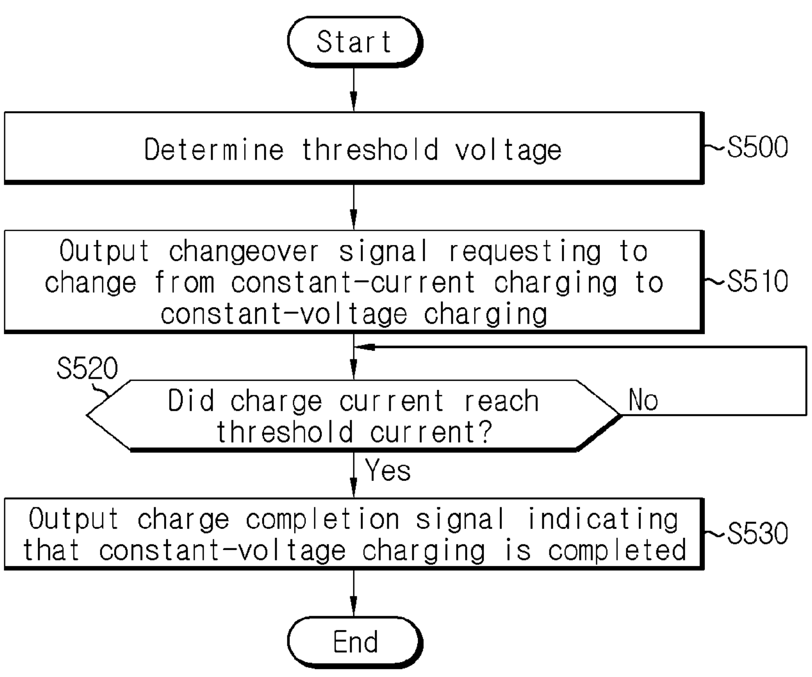
FIG. 5 is a flowchart exemplarily showing a battery management method according to a second embodiment of the present disclosure.

FIG. 5 is a flowchart exemplarily showing a battery management method according to a second embodiment of the present disclosure. The method of FIG. 5 is for constant-voltage charging included in the charge cycle. The method of FIG. 5 may be performed by the control unit 140 when the constant-current charging by the method of FIG. 4 is completed.

Referring to FIGS. 1 to 5, in step S500, the control unit 140 determines a threshold voltage. The threshold voltage may indicate a voltage of the battery 11 at the time point at which the charge factor of the battery 11 reaches the last $m^{th}$ changeover value among the first to $m^{th}$ changeover values. When a voltage rather than SOC is used as the charge factor, the threshold voltage may be equal to the $m^{th}$ changeover value. Alternatively, the threshold voltage may be a preset voltage level, and in this case, the step S500 may be omitted from the method of FIG. 5.

In step S510, the control unit 140 outputs a changeover signal requesting to change from constant-current charging to constant-voltage charging. The interface unit 130 may transmit the changeover signal to the charger 50. The changeover signal may be a signal requesting to terminate the constant-current charging, and set the charge voltage to be equal to the threshold voltage. The charger 50 supplies the charge voltage equal to the threshold voltage to the battery 11 in response to the changeover signal.

In step S520, the control unit 140 determines whether the charge current of the battery 11 reached the threshold current. Since the voltage of the battery 11 gradually increases during constant-voltage charging, the current of the battery 11 gradually reduces down to the threshold current. The threshold current is preset, such as, for example, 0.1 A. The control unit 140 may repeatedly perform the step S520 at a predetermined interval when a value of the step S520 is "No", until the value of the step S520 is "Yes". When the value of the step S520 is "Yes", step S530 is performed.

In step S530, the control unit 140 outputs a charge completion signal indicating that constant-voltage charging is completed. The interface unit 130 may transmit the charge completion signal to the charger 50. The charger 50 may terminate the charge cycle by electrical decoupling from the battery 11 in response to the charge completion signal.

The embodiments of the present disclosure described hereinabove are not implemented only through the apparatus and method, and may be implemented through programs that perform functions corresponding to the configurations of the embodiments of the present disclosure or recording media having the programs recorded thereon, and such implementation may be easily achieved by those skilled in the art from the disclosure of the embodiments previously described.

While the present disclosure has been hereinabove described with regard to a limited number of embodiments and drawings, the present disclosure is not limited thereto and it is obvious to those skilled in the art that various modifications and changes may be made thereto within the technical aspects of the present disclosure and the equivalent scope of the appended claims.

Additionally, as many substitutions, modifications and changes may be made to the present disclosure described hereinabove by those skilled in the art without departing from the technical aspects of the present disclosure, the present disclosure is not limited by the above-described embodiments and the accompanying drawings, and some or all of the embodiments may be selectively combined to allow various modifications.

What is claimed is:

1. A battery management system, comprising:

a sensing unit configured to generate a sensing signal indicating a voltage and a current of a battery;

a memory unit configured to store a reference charging map for constant-current charging using first to mth reference current rates (C-rates), wherein m is a natural number of 2 or greater; and a control unit configured to determine a start value indicating a charge factor of the battery at a time point at which a charge command is received based on the sensing signal in response to the charge command being received, wherein the control unit is configured to:

generate first to mth reference charge functions corresponding to the first to mth reference C-rates in a one-to-one relationship from the reference charging map, wherein each reference charge function indicates an adjustable charge factor increase and an adjustable changeover value as a function of the start value, wherein the charge factor increase is an amount of electrical energy stored in the battery that increases while the battery is charged at the corresponding reference C-rate of the reference charge function, and wherein the changeover value is a maximum charge factor at which the battery is charged at the corresponding reference C-rate of the reference charge function, and when a charge cycle including the constant-current charging starts:

for each reference charge function, determine the changeover value of the reference charge function based on the start value, and control a charge current supplied to the battery using the first to mth reference C-rates in a sequential order based on the sensing signal, and the first to mth reference charge functions.

2. The battery management system according to claim 1, wherein the control unit is configured to replace the reference charging map stored in the memory unit with the first to mth reference charge functions.

3. The battery management system according to claim 1, wherein each reference charge function is a multi-degree polynomial function, and wherein the control unit is configured to generate the first to $m^{th}$ reference charge functions using a curve fitting technique.

4. The battery management system according to claim 1, wherein each reference charge function is a multi-degree polynomial function.

5. The battery management system according to claim 1, wherein the reference charging map includes first to mth reference arrays corresponding to the first to mth reference C-rates in a one-to-one relationship, each reference array includes first to nth reference values and first to nth boundary values, wherein n is a natural number of 2 or greater, and when i is a natural number between 2 and m, and j is a natural number between 1 and n:

a jth boundary value of the first reference array indicates an allowable limit value for constant-current charging with the first reference C-rate when the charge cycle starts at a time point at which the charge factor of the battery is equal to a jth reference value, and a jth boundary value of an ith reference array indicates an allowable limit value for constant-current charging with an ith reference C-rate from a time point at which the charge factor of the battery reaches a jth boundary value of a i−1th reference array.

6. The battery management system according to claim 5, wherein the ith reference C-rate is smaller than a i−1th reference C-rate.

7. The battery management system according to claim 5, wherein when k is a natural number between 2 and n, a kth reference value is larger than a k−1th reference value, and a kth boundary value of the ith reference array is larger than a k−1th boundary value of the ith reference array.

8. The battery management system according to claim 5, wherein the control unit is configured to output a first control signal, wherein the first control signal is a signal requesting to set the charge current to be equal to the first reference C-rate.

9. The battery management system according to claim 8, wherein z is an index value, and when z is a natural number less than m, the control unit is configured to increase z by 1 and output a zth control signal in response to the charge factor of the battery reaching a zth changeover value by the charge current of a zth reference C-rate, and wherein the zth control signal is a signal requesting to set the charge current to be equal to the zth reference C-rate.

10. The battery management system according to claim 9, wherein the control unit is configured to output a changeover signal requesting to change from the constant-current charging to constant-voltage charging with a threshold voltage in response to the charge factor of the battery reaching the mth changeover value by the charge current of the mth reference C-rate.

11. The battery management system according to claim 10, wherein the control unit is configured to set the threshold voltage to be equal to the voltage of the battery at a time point at which the charge factor of the battery reaches the mth changeover value.

12. The battery management system according to claim 10, wherein the control unit is configured to terminate the constant-voltage charging in response to the current of the battery reaching a threshold current during the constant-voltage charging.

13. A battery pack comprising the battery management system according to claim 1.

14. An electric vehicle comprising the battery pack according to claim 13.

15. A battery management method, comprising:

generating first to mth reference charge functions corresponding to first to mth reference C-rates in a one-to-one relationship from a reference charging map for constant-current charging using the first to mth reference C-rates, and wherein each reference charge function indicates an adjustable charge factor increase and an adjustable changeover value as a function of a start value, wherein the charge factor increase is amount of electrical energy stored in the battery that increases while the battery is charged at the corresponding reference C-rate of the reference charge function, and wherein the changeover value is a maximum charge factor at which the battery is charged at the corresponding reference C-rate of the reference charge function;

in response to receiving a charge command, determining the start value which is the charge factor of the battery at a time point at which the charge command is received;

determining first to mth changeover values from the first to mth reference charge functions respectively based on the start value;

outputting a first control signal requesting to set a charge current to be equal to the first reference C-rate to start a charge cycle including the constant-current charging; and wherein z is an index value, when z is a natural number that is less than m, increasing z by 1 and outputting a zth control signal requesting to set the charge current to be equal to the zth reference C-rate in response to the charge factor of the battery reaching the zth changeover value by the charge current of the zth reference C-rate.

* * * * *